United States Patent
Chen et al.

(10) Patent No.: US 7,105,799 B2
(45) Date of Patent: Sep. 12, 2006

(54) APPARATUS AND METHOD FOR AN ELECTRONICALLY TUNED, WAVELENGTH-DEPENDENT OPTICAL DETECTOR

(75) Inventors: Ray Chen, Stanford, CA (US); David A. B. Miller, Stanford, CA (US)

(73) Assignee: The Board of Trustees of the Leland Stanford Junior Universtiy, Palo Alto, CA (US)

( * ) Notice: Subject to any disclaimer, the term of this patent is extended or adjusted under 35 U.S.C. 154(b) by 142 days.

(21) Appl. No.: 10/917,272

(22) Filed: Aug. 11, 2004

(65) Prior Publication Data

US 2005/0087677 A1 Apr. 28, 2005

(51) Int. Cl.
*H01L 31/00* (2006.01)
*G01B 9/02* (2006.01)

(52) U.S. Cl. ............... 250/214.1; 250/226; 250/550; 356/451

(58) Field of Classification Search ............ 250/214.1, 250/214 R, 226, 237 G, 550; 356/451, 454, 356/477, 450, 519
See application file for complete search history.

(56) References Cited

U.S. PATENT DOCUMENTS

| 4,754,130 A | 6/1988 | Kostenbauder | 250/211 R |
|---|---|---|---|
| 4,951,106 A | 8/1990 | Blouke | 357/30 |
| 5,206,708 A | 4/1993 | Knapp et al. | 356/416 |
| 5,498,863 A | 3/1996 | Miller | 250/214.1 |
| 5,637,862 A | 6/1997 | Paolella | 250/214.1 |
| 5,747,791 A | 5/1998 | Coroy | 250/214 R |
| 6,331,892 B1 | 12/2001 | Green | 356/451 |
| 6,818,880 B1* | 11/2004 | Pepper et al. | 250/214.1 |
| 6,859,284 B1* | 2/2005 | Rella et al. | 356/519 |
| 6,937,346 B1* | 8/2005 | Nebendahl et al. | 356/519 |
| 2002/0140947 A1* | 10/2002 | Harker | 356/519 |
| 2003/0107746 A1* | 6/2003 | Hedin et al. | 356/519 |

\* cited by examiner

*Primary Examiner*—Stephone B. Allen
*Assistant Examiner*—Davienne Monbleau
(74) *Attorney, Agent, or Firm*—Lumen Intellectual Property Services, Inc

(57) ABSTRACT

An electronically tuned, wavelength-dependent optical detector is provided. The electronically tuned, wavelength-dependent optical detector is a modified metal-semiconductor-metal photodetector including a comb-like metal electrode at a common voltage and metal electrodes each supplied with a control voltage by a voltage means. The wavelength to be detected in an optical input illuminating the detector is selected based on the set of control voltages applied to the metal electrodes. In another embodiment of the invention, the wavelength to be detected with the electronically tuned, wavelength-dependent optical detector is also selected using a standing wave generator, such as an interferometer, to produce a spatially varying light intensity on the surface of the electronically tuned, wavelength-dependent optical detector. Electronic wavelength demultiplexing is also provided. Design flexibility can be obtained by providing two or more optical patterns at a detector surface, each pattern having a different wavelength dependence.

16 Claims, 13 Drawing Sheets

APPARATUS AND METHOD FOR AN ELECTRONICALLY TUNED, WAVELENGTH-DEPENDENT OPTICAL DETECTOR

STATEMENT REGARDING FEDERALLY SPONSORED RESEARCH OR DEVELOPMENT

This invention was made with Government support under contract DAAD17-02-C-0101awarded by the Department of the Army. The Government has certain rights in this invention.

FIELD OF THE INVENTION

The present invention relates generally to an apparatus and method for an electronically tuned, wavelength-dependent optical detector.

BACKGROUND OF THE INVENTION

Wavelength-dependent optical detectors are essential optical components that are incorporated in a myriad of applications including spectrometers, optical interconnects and optical communications systems.

An existing wavelength-dependent optical detector is the so-called metal-semiconductor-metal (MSM) photodetector. In this device, an interdigitated pair of metal electrodes is deposited on a surface of a semiconductor. Light illuminating the MSM device is absorbed in the semiconductor producing charge carriers that drift to the neighboring metal electrodes when a voltage is applied to the metal electrodes. The resulting light-induced current is amplified and detected by an amplifier. The wavelength-dependence of the MSM device is partially determined by the absorption characteristics of the semiconductor in the MSM device. GaAs is used as the semiconductor for MSM devices in the 800 nm wavelength range. InAlAs deposited on InGaAs is used as the semiconductor for MSM devices in the 1600 nm wavelength range. The prior art teaches that the wavelength-dependence of the MSM device can be further selected by creating a standing wave on the MSM detector and fabricating the MSM device such that metal electrodes have a particular spacing, for example, a quarter of the wavelength of light to be detected.

While such MSM devices have been successfully employed in a variety of applications, a principal limitation of the MSM device is that the wavelength-dependence cannot be dynamically tuned. It is manifest that this is also the case for other optical detectors that are not wavelength-dependent, such as photodiodes and photomultiplier tubes. Prior art solutions to this technical challenge include external means for dynamically tuning the wavelength of light detected. Solutions include monochromators, interferometers, multiplexers/demultiplexers, spatial optical filters, spectral optical filters (including cavity resonators) and diffraction gratings. For example, see U.S. Pat. Nos. 6,583, 900, 6,594,410 and 6,597,841. However, the speed with which the selected wavelength can be changed in these approaches is limited when the dynamic tuning is based on mechanical motion, such as that associated with a stepper motor or thermal expansion. This is also the case when the dynamic tuning is based on the propagation of waves (for example, sound) in a medium, such as in an acousto-optic modulator or a dynamic diffraction grating. The response time for dynamic tuning of the wavelength-dependence of the existing optical detectors in conjunction with such external means is substantially longer than a microsecond and is typically hundreds to thousands of microseconds. A PIN detector with multiple quantum wells can be dynamically tuned with a fast response time; however, such devices only have a coarse tuning capability over a small range of wavelengths and require a large biasing voltage. These limitations in the dynamic tuning of the wavelength dependence of existing optical detectors are particularly problematic in existing or proposed optical communications systems based on Wavelength Division Multiplexing (WDM).

In optical communications systems based on WDM, a combination of time dependent multiplexing (interleaved packets of information), frequency dependent multiplexing (information communicated using multiple, different wavelengths) and/or spread spectrum (wideband) encoding techniques such as code division multiple access are used. Systems include coarse wavelength division multiplexing (CWDM) and dense wavelength division multiplexing (DWDM). Recent proposals include 80 channels utilizing a wavelength range centered around 1550 nm (193,300 GHz) with a channel spacing of approximately 0.4 nm (50 GHz) and optical packets of information spaced on time scales on the order of nanoseconds. Future systems will employ more channels (smaller channel spacing) and packets of information spaced on shorter time scales.

To be useful in detecting packets of information based on wavelength in a WDM system, it is highly desirable to be able to switch the wavelength dependence of the optical detector on times scales on the order of or less than the length of the optical packets of information. This necessitates response times for dynamic tuning of the wavelength dependence of the optical detector of a few nanoseconds or less. Response times of this order are well beyond the capability of most of the existing solutions. The alternative, involving a plurality of wavelength-dependent optical detectors with slow dynamic tuning response times, would be expensive and difficult to manufacture and maintain. Each wavelength in the optical system would require a separate detector, the related electronics for amplifying detected signals, as well as a fixed optical filter capable of resolving the small band of wavelengths corresponding to the channel spacing. For example, see U.S. Pat. Nos. 5,546,209, 5,910, 851, 6,307,660 and 6,556,321.

As a consequence, there is a need for a wavelength-dependent optical detector that can be dynamically tuned with a response time less than a few nanoseconds for WDM applications, and more generally with a response time less than a microsecond for other applications. It would also be advantageous if the wavelength-dependent optical detector could be dynamically tuned to resolve the narrow channel spacing in WDM systems yet have a wide tuning range. Furthermore, it would be advantageous if such a wavelength-dependent optical detector with fast dynamic tuning were electronically controlled using a low voltage thereby allowing ease of integration with other components.

Objects and Advantages

In view of the above, it is a primary object of the present invention to provide an apparatus and method for a wavelength-dependent optical detector that can be dynamically tuned over a wide range with a response time of less than a few nanoseconds. More specifically, it is an object of the present invention to provide an electronically tuned, wavelength-dependent optical detector.

These and numerous other objects and advantages of the present invention will become apparent upon reading the following description.

SUMMARY

The objects and advantages of the present invention are secured by an apparatus and method for an electronically tuned, wavelength-dependent optical detector. The electronically tuned, wavelength-dependent optical detector is a modified MSM photodetector. In the modified MSM device, a comb-like metal electrode, comprising at least five, substantially parallel arms with a fixed spacing from each other and having a common voltage, is deposited on a surface of a semiconductor. At least four metal electrodes, interdigitated with the comb-like metal electrode are also deposited on the surface of the semiconductor. Each of the metal electrodes is connected to a voltage means that applies a control voltage to each metal electrode. By applying a set of control voltages to the metal electrodes using the voltage means, a wavelength to be detected in a stream of light illuminating the modified MSM device is selected.

In one embodiment of the invention, the comb-like metal electrode in the modified MSM device is connected to an amplifier.

In another embodiment, an opaque coating is deposited on parts of the surface of the modified MSM device thereby grouping the arms of the comb-like metal electrode and the metal electrodes into pairs.

In another embodiment, the semiconductor in the modified MSM device is selected based on the wavelengths to be detected. GaAs is used for MSM devices in the 800 nm wavelength range. InAlAs deposited on InGaAs is used for MSM devices in the 1600 nm wavelength range.

In another embodiment, a plurality of modified MSM devices are used in an optical system where a stream of light comprised of multiple wavelengths is at least partially spatially segregated using a dispersion device.

In another embodiment, a standing wave generator is used to produce a spatially varying light intensity of the surface of the modified MSM device. By appropriately positioning the modified MSM device relative to the varying light intensity and applying a set of voltages to the metal electrodes using the voltage means, the wavelength to be detected is selected.

In another embodiment, the standing wave generator is an interferometer, and position of fringes in the spatially varying light intensity on the electronically tuned, wavelength-dependent optical detector is adjusted by varying the optical path-length difference in the interferometer. In addition, the wavelength spacing of the detected channels is adjusted by changing the optical path-length difference.

In another embodiment, the standing wave generator is an interferometer that interferes two beams separated by an angle on the MSM device, and the relative phase of the fringes in the spatially varying light intensity and the channel spacing is adjusted by varying the optical path-length difference in the interferometer.

In yet another embodiment, the standing wave generator is an interferometer that interferes two beams separated by an angle on the MSM device, and period of the fringes in the spatially varying light intensity is adjusted by varying the angle of incidence of the interfered beams.

Another embodiment of the invention provides multiple outputs from a single detector for electronic wavelength demultiplexing. The multiple outputs are combined with electrically adjustable weights to provide one or more demultiplexer output channels which are electrically tunable.

Still other embodiments of the invention provide enhanced design flexibility by detecting two or more optical patterns having different wavelength dependences. Some of these embodiments can be understood in terms of Fourier series. A particularly simple example of such an embodiment is a detector having one wavelength dependent pattern (e.g., a fringe pattern) and one wavelength independent pattern (e.g., a simple beam spot).

A detailed description of the invention and the preferred and alternative embodiments is presented below in reference to the attached drawing figures.

DETAILED DESCRIPTION OF THE EMBODIMENTS

Figure 1:
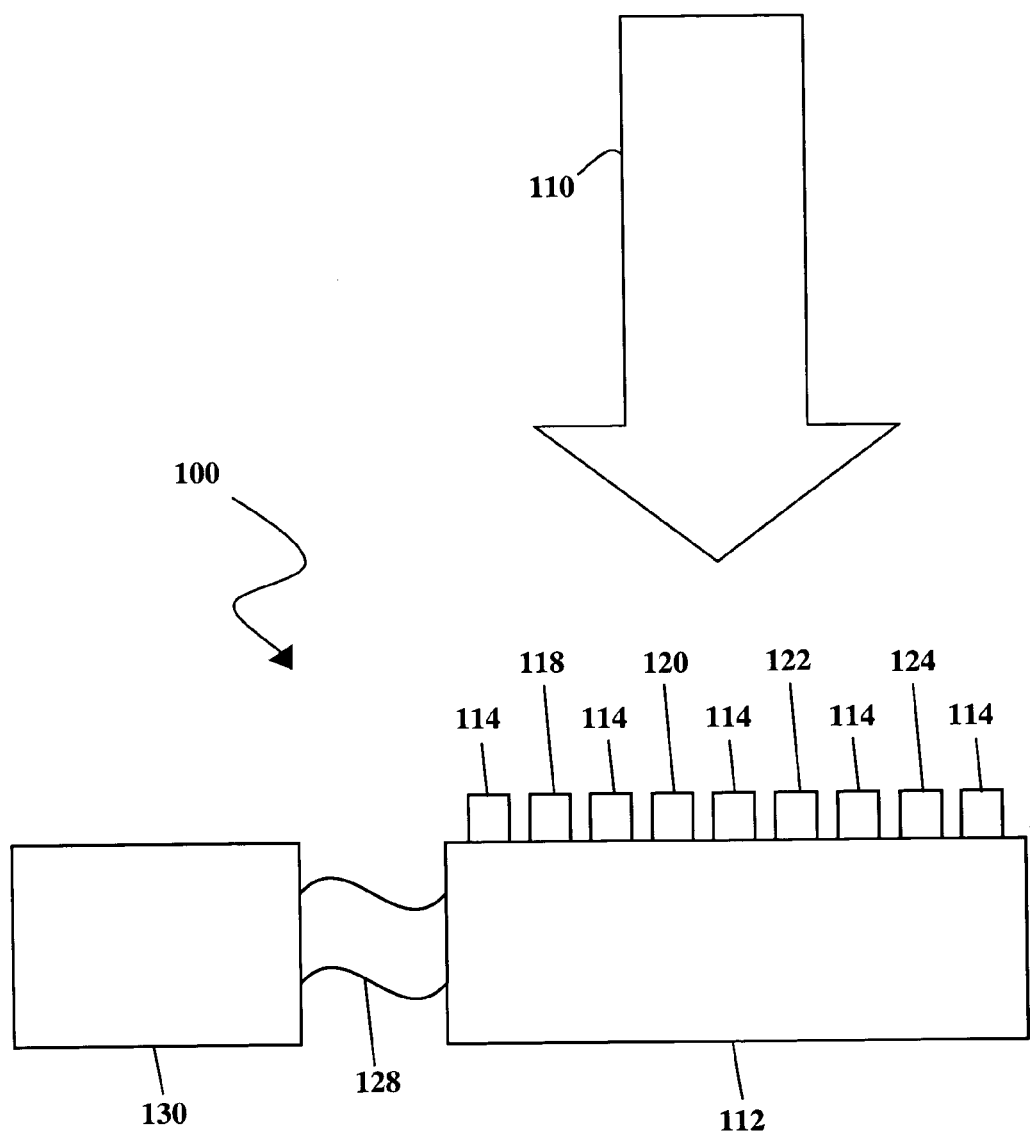
FIG. 1 is a diagram illustrating a side view of an apparatus according to the invention.

A side view of an embodiment of the invention is illustrated in FIG. 1. A stream of light 110 comprising at least one wavelength illuminates an electronically tuned, wavelength-dependent optical detector apparatus 100. The apparatus 100 is a modified MSM photodetector. The apparatus 100 has a comb-like metal electrode 114, comprising at least five, substantially parallel arms with a fixed spacing from each other and maintained at a common voltage. The parallel arms of metal electrode 114 are deposited on a surface of a semiconductor 112. At least four metal electrodes 118, 120, 122 and 124, interdigitated with the comb-like metal electrode 114 are also deposited on the surface of the semiconductor 112. Each of the metal electrodes 118, 120, 122 and 124 is connected by an electrical connection 128 to a voltage means 130, such as a power supply, that applies a control voltage to each metal electrode 118, 120, 122 and 124. In an alternative embodiment, the voltage means 130 is flip-chip bonded to the semiconductor 112. The stream of light 110 is absorbed in the semiconductor 112 producing charge carriers that drift to the neighboring metal electrodes 118, 120, 122 or 124 or the arms in the comb-like metal electrode 114 when the control voltage is applied to each of the metal electrode 118, 120, 122 and 124.

Figure 2:
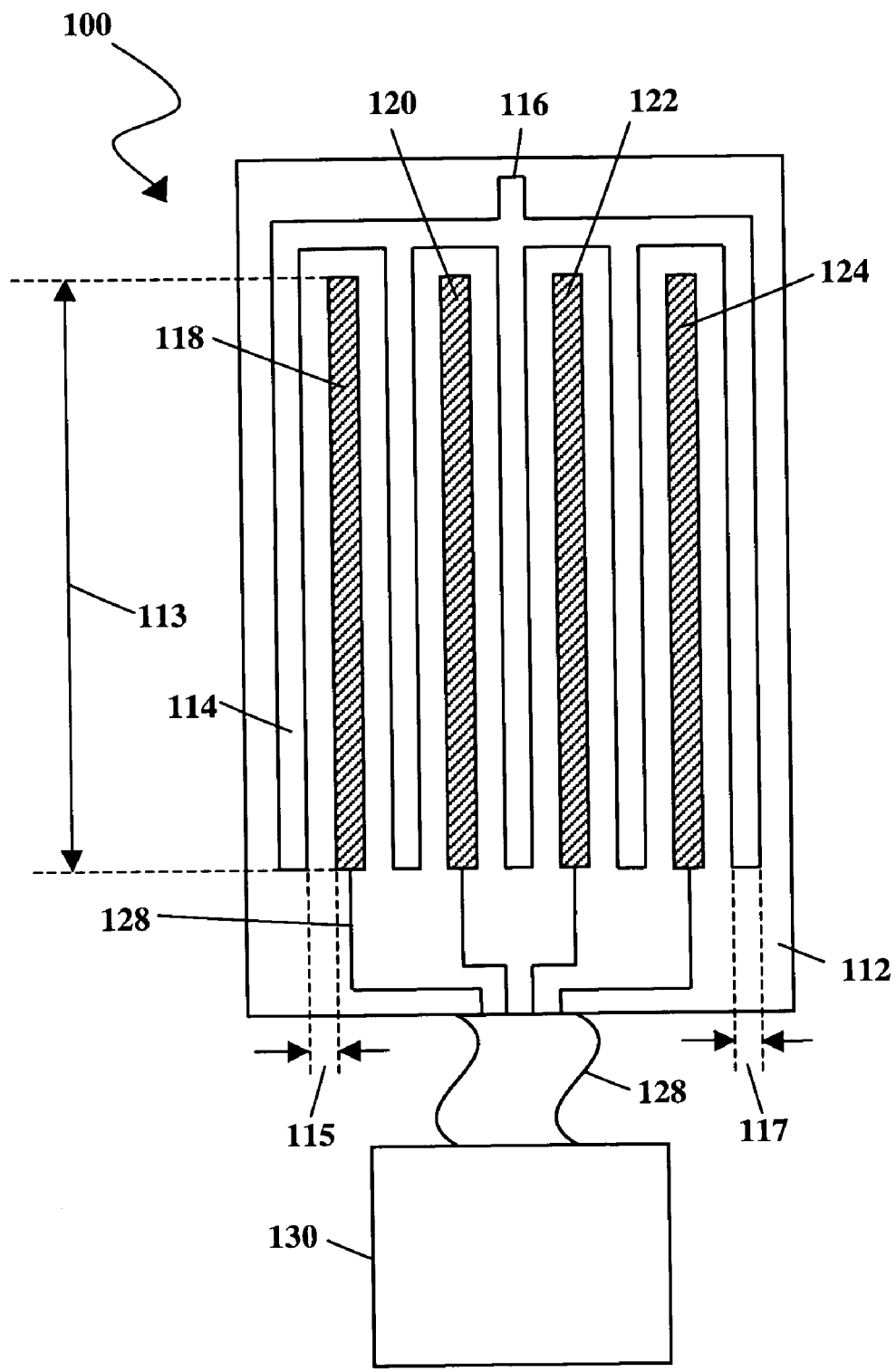
FIG. 2 is a diagram illustrating a top view of an apparatus according to the invention.

FIG. 2 illustrates a top view of the apparatus 100, with the comb-like metal electrode 114 deposited on the surface of the semiconductor 112. The comb-like metal electrode 114 has a common connection point 116. At least four metal electrodes 118, 120, 122 and 124, interdigitated with the comb-like metal electrode 114, are deposited on the surface of the semiconductor 112. The metal electrodes 118, 120, 122 and 124 are connected by the electrical connection 128 to the voltage means 130.

Figure 3:
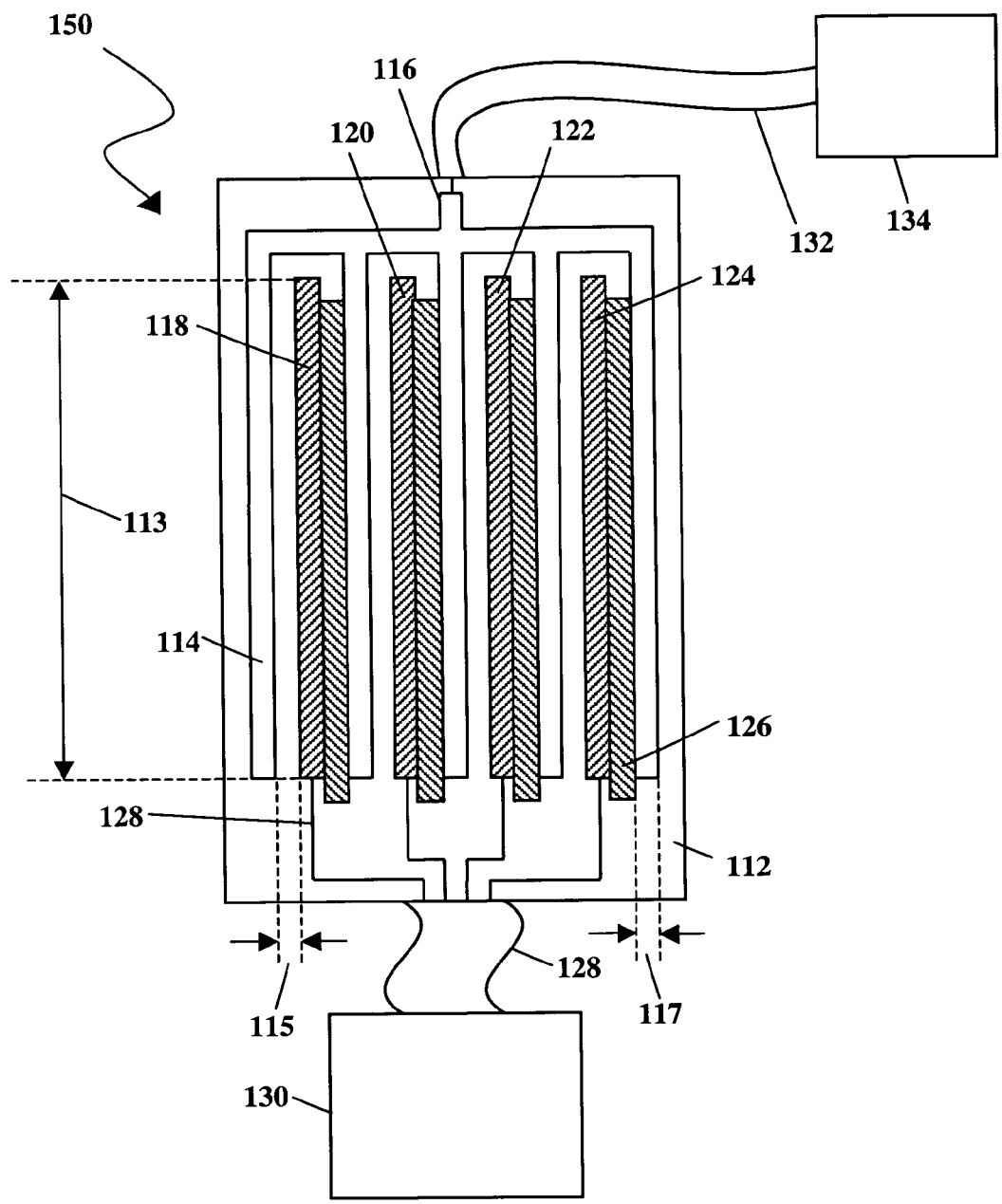
FIG. 3 is a diagram illustrating a top view of another embodiment of an apparatus according to the invention.

FIG. 3 illustrates a top view of alternative embodiments of apparatus 150. In this embodiment, an opaque coating 126 is deposited on the surface of the semiconductor 112 such that the arms in the comb-like metal electrode 114 are paired with one of the metal electrodes 118, 120, 122 and 124. Another alternative embodiment has an amplifier 134 connected 132 to the common connection point 116 of the comb-like metal electrode 114. In a preferred embodiment, the amplifier 134 is a trans-impedance amplifier. In yet another alternative embodiment, the amplifier 134 is flip-chip bonded to the semiconductor substrate 112.

Figure 4:
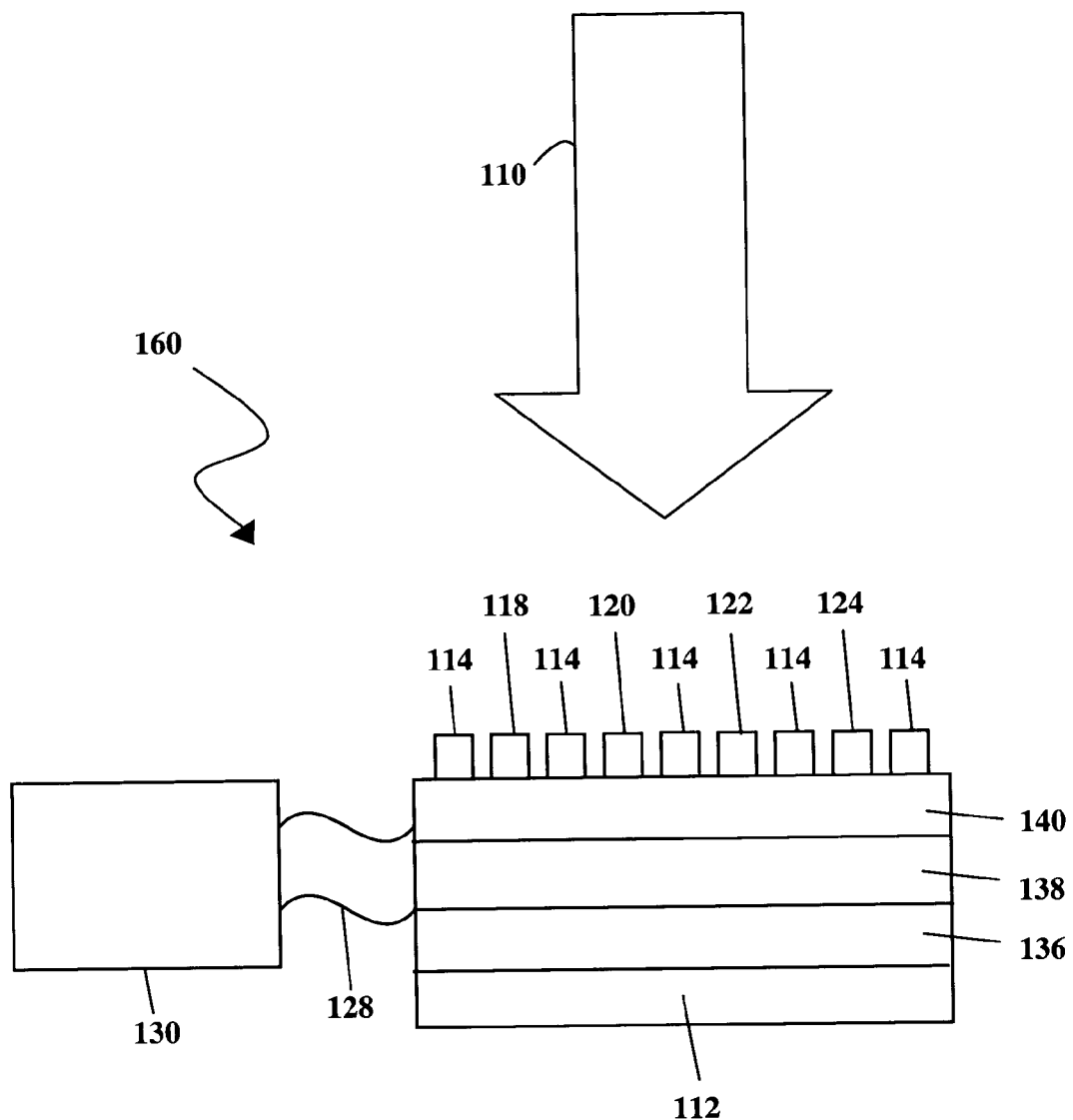
FIG. 4 is a diagram illustrating a side view of another embodiment of an apparatus according to the invention.

FIG. 4 illustrates a side view of alternative embodiments of apparatus 160. One alternative embodiment has an optional base layer 136, an optional intermediate layer 138 and an optional top layer 140 deposited in layers located above the surface of the semiconductor 112 and below the layer containing the comb-like metal electrode 114 and the metal electrodes 118, 120, 122 and 124. For wavelengths in the stream of light 110 less than 860 nm, a preferred embodiment has a semi-insulating GaAs semiconductor 112, a substantially 0.3 micron thick GaAs base layer 136 as a buffer, a substantially 0.3 micron AlGaAs intermediate layer 138 comprising relative proportions of substantially 85% aluminum and 15% gallium in the AlGaAs compound and being substantially 1 micron thick, and an undoped GaAs top layer 140 that functions as the active layer in the apparatus 160 absorbing the stream of light 110. The intermediate layer 138 in this embodiment serves two functions: it acts as an etch stop for etching through the semiconductor 112, thereby allowing flip-chip bonding of electronics such as the voltage means 130 and the amplifier 134 to the apparatus 160, and it acts as a barrier to keep carriers in the top layer 140 thereby improving temporal response of the apparatus 160 when stream of light 110 is absorbed in the top layer 140.

When the intermediate layer 138 is used as an etch stop layer, after flip-chip bonding of electronics such as the voltage means 130 and the amplifier means 134, the entire substrate layer 112 can be chemically removed using a selective etch or etches well known to those skilled in the art, with the etch substantially stopping when layer 138 is reached. In this case, stream of light 110 can impinge on the intermediate layer 138 from the bottom, which may be convenient since the flip-chip bonded electronics might otherwise get in the way of the stream of light 110 when the stream of light 110 is incident from above as shown in FIG. 4.

For wavelengths in the stream of light 110 substantially larger than 850 nm but less than 1650 nm, such as wavelength in the range 1200–1600 nm commonly used in telecommunications, a preferred embodiment has a semi-insulating InP semiconductor 112, an InP base layer 136 as a buffer, an undoped InGaAs intermediate layer 138 (comprising substantially 47% In and substantially 53% Ga and As) that functions as the active layer in the apparatus 160 absorbing the stream of light 110, and a thin InAlAs top layer 140 that increases the Schottky barrier height in the apparatus 160 and thereby reduces the leakage current that flows even when the stream of light 110 does not illuminate the apparatus 160.

Those skilled in the art will recognize that the details of the wafer structure can be modified for other applications of the invention in spectroscopy, optical interconnects, optical sensing and optical detection since the range of wavelength that can be detected with the apparatus 160 are confined to the absorption range of the semiconductor in the active layer of the apparatus 160.

As described thus far, the apparatus 160 cannot distinguish between two wavelengths so long as they are within the absorption range of the semiconductor in the active layer of the apparatus 160. For example, an apparatus with a GaAs active layer cannot distinguish 850 nm from 840 nm. To further distinguish the wavelength in the stream of light 110 to be detected in this invention, rapid, electronic tuning of the apparatus 160 occurs by varying the control voltage applied by the voltage means 130 to each of the metal electrodes 118, 120, 122 and 124. Temporal response of the apparatus 160 to a change in the control voltage is determined by resistance-capacitance (RC) time constant. For the apparatus 160 with the arms in the comb-like metal electrode 114 and the metal electrodes 118, 120, 122 and 124 having tens of micron length 113 (in FIGS. 2 and 3) and with micron spacing 115 (in FIGS. 2 and 3) between the arms in the comb-like metal electrode 114 and the metal electrodes 118, 120, 122 and 124, and width 117 of comb-like metal electrode 114 and the metal electrodes 118, 120, 122 and 124, capacitance of the apparatus 160 is less than several hundred fF. For the MSM device 100 in FIG. 2 with 0.8 micron electrode spacing 115 and width 117 and with interdigitated pattern covering total area of 100 micron length (not shown) by 52 micron width (not shown), the capacitance is theoretically 167.25 fF. For the MSM device 100 in FIG. 2 with 0.8 micron electrode spacing 115 and width 117 and with the interdigitated pattern covering total area of 40 micron length (not shown) by 26.4 micron width (not shown), the capacitance is theoretically 33.5 fF. Referring back to FIG. 4, in conjunction with low resistance of the apparatus 160, the temporal response of the apparatus 160 to change in the control voltage is less than a nanosecond. The rapid, electronic tuning of the apparatus 160 in this invention is further described below.

Figure 8:
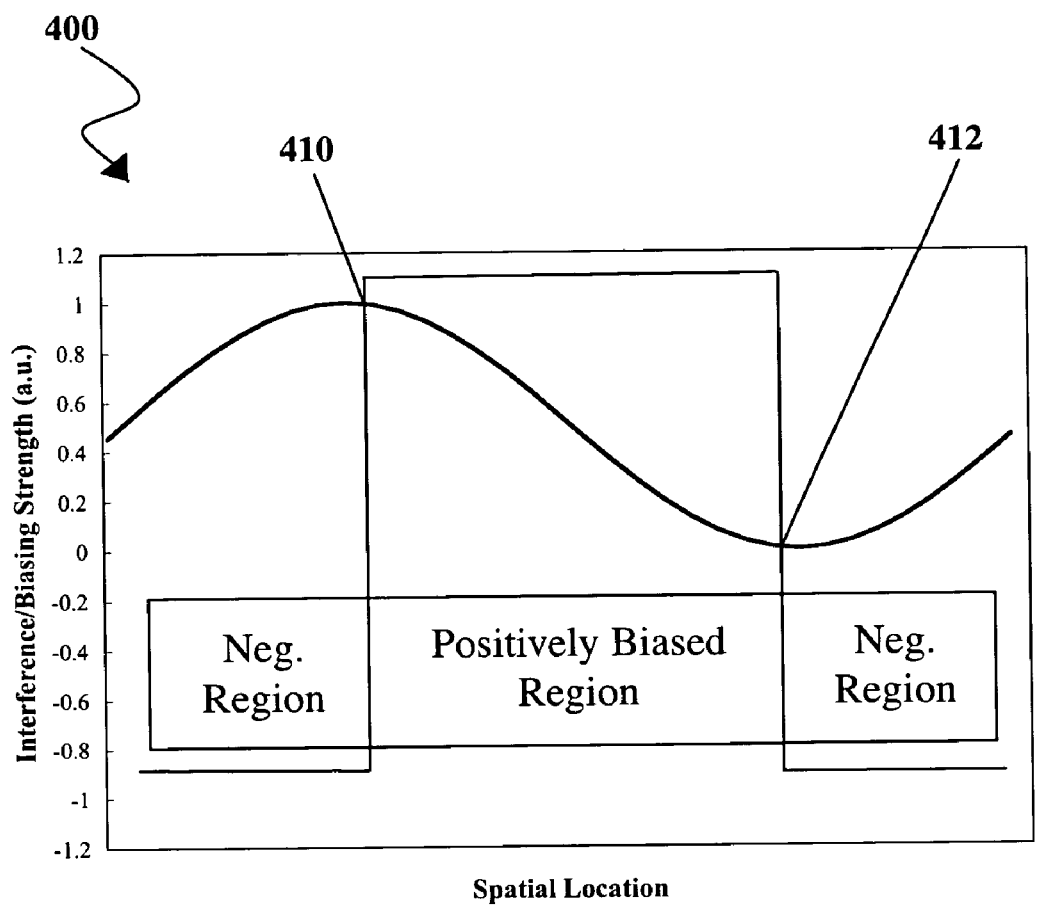
FIG. 8 is a diagram illustrating a biasing configuration relative to the fringes of an interference pattern for an apparatus according to the invention.

FIG. 8 schematically illustrates the electronic tuning of the wavelength in this invention. Here a spatially varying light intensity 400 corresponding to a wavelength in the beam of light 110 is shown on the surface of the apparatus 100 with a fringe period between adjacent maxima 410 (or adjacent minima 412) preferably equal to the device width. For example, in apparatus 100 of FIG. 2, the device width is the distance between the centers of the two outermost tines of comb electrode 116. Note that it is also important that the apparatus 100 be appropriately positioned relative to the spatially varying light intensity. In this example, the locations of the maxima 410 and the minima 412 in the spatially varying light intensity 400 are aligned with the locations of the comb-like metal electrode 114. If a negative control voltage is applied by the voltage means 130 to the metal electrodes 118 and 124, and a positive control voltage is applied by the voltage means 130 to the metal electrodes 120 and 122, the wavelength in the stream of light 110 that gives rise to the spatially varying light intensity 400 in FIG. 8 will give rise to zero net current and thus will not be detected. In contrast, the same control voltages will allow a neighboring wavelength with maxima 414 and minima 416, shown by the dashed line in FIG. 9, to produce a net current and therefore to be detected.

In principle, due to its symmetric structure, the current-voltage characteristic of the ideal electronically tuned, wavelength-dependent optical detector apparatus 100 has positive/negative symmetry with respect to the control voltage applied by the voltage means 130 to the metal electrodes 118, 120, 122 and 124. In practice, variations in fabrication may necessitate different voltages when wavelength-dependent optical detector apparatus 100 is illuminated by stream of light 110 with fringe intensity variation 400.

The detection of multiple wavelengths with a single apparatus 100 is enabled by this invention by increasing the number of metal electrodes 118, 120, 122 and 124 and the corresponding arms in the comb-like metal electrode 114 in the apparatus 100. The detection of multiple wavelengths with a single apparatus 100 is further enabled by appropriately positioning the apparatus relative to the spatially varying light intensity on the surface of the apparatus 100, i.e., by selecting the appropriate spatial phase relation, and by applying the appropriate control voltage to each metal electrode 118, 120, 122 and 124.

Figure 10:
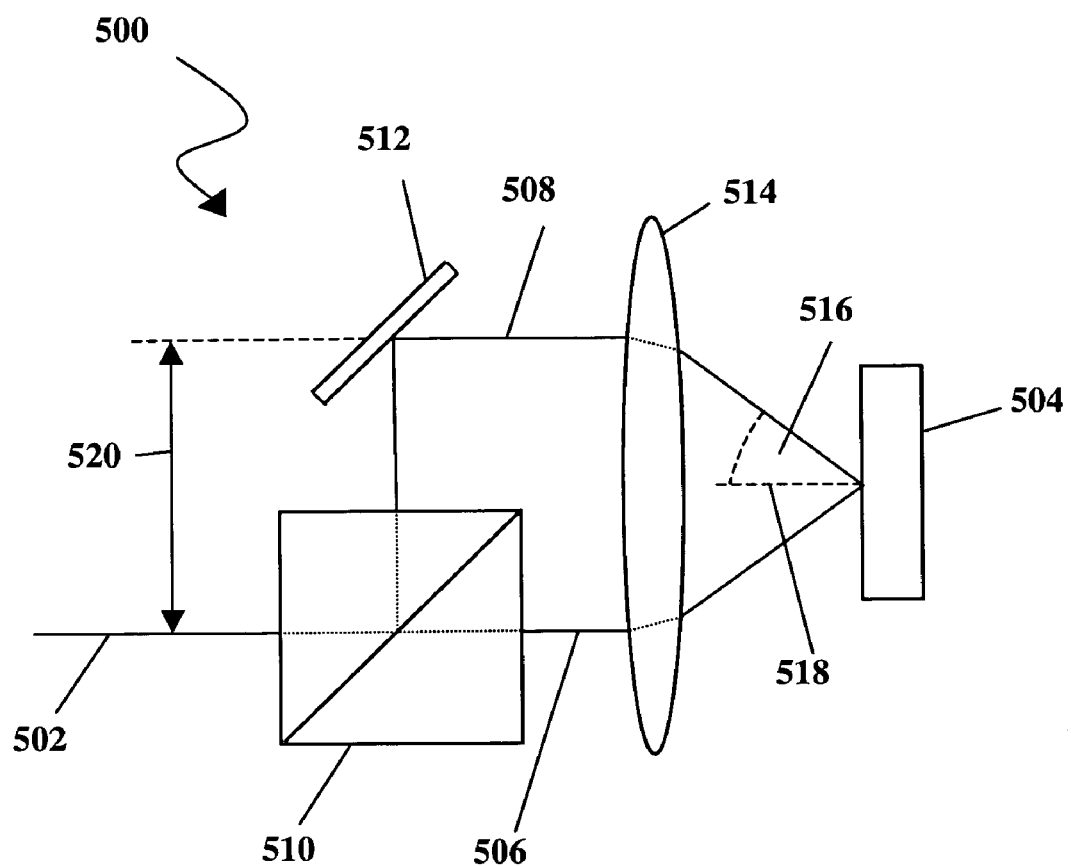
FIG. 10 is a diagram illustrating an experimental set-up.

FIG. 10 illustrates in an exemplary embodiment how a standing wave generator such as an interferometer 500 is used to produce the spatially varying light intensity and to select relative phase of this spatially varying light intensity on wavelength dependent optical detector 504. A beam of light 502 is divided into two beams of light 506 and 508 by a beam splitter 510. Beam of light 508 is reflected off of mirror 512. Beams of light 506 and 508 pass through a lens 514 and are incident on the wavelength dependent optical detector 504 with an incident angle 516 relative to the normal 518 of the wavelength dependent optical detector 504. Beams of light 506 and 508 interfere due to a relative difference 520 in their optical path lengths. Such a path length difference 520 results in a time delay between the two beams 506 and 508 because of the additional time taken for light to propagate through the additional distance 520 in the path of beam of light 508. As a result of this delay and the incident angle 516 relative to the normal to the wavelength dependent optical detector 504, when the wavelength changes, the spatially varying light intensity substantially moves, corresponding to a change of the relative phase of the spatially varying light intensity. There is also a change in period of the spatially varying light intensity, although for small wavelength changes the variation in position of the spatially varying light intensity (and thus the relative phase) is more important for the operation of the wavelength-dependent optical detector 504. Additional means for forming such spatially varying light intensities on the surface of detectors with multiple elements are discussed in D. A. B. Miller, "Laser Tuners and Wavelength-Sensitive Detectors Based on Absorbers in Standing Waves," IEEE Journal of Quantum Electronics, 30, 732–749 (1994), which is hereby incorporated by reference.

The dependence of the spacing between fringes in the spatially varying light intensity on the incident angle 516 of the two interfered beams of light 506 and 508 can be conceptually understood in terms of a plane wave with a fixed wavelength $\lambda$ incident at an angle $\Omega$ relative to the normal of a flat mirror. The effective period of the standing wave pattern projected on the mirror is $\lambda/\sin(\Omega)$. Since $\sin(\Omega)$ is always less than one, if beams of light 506 and 508 are incident at incident angle 516 (equal to $\Omega$) with respect to the wavelength dependent optical detector 504, the fringe width in the interference pattern, given by $\lambda/(2 \sin(\Omega))$, is increased compared to half a wavelength $\lambda/2$.

The theory behind the wavelength-dependent optical detector in this invention is described below for two illustrative examples.

Figure 9:
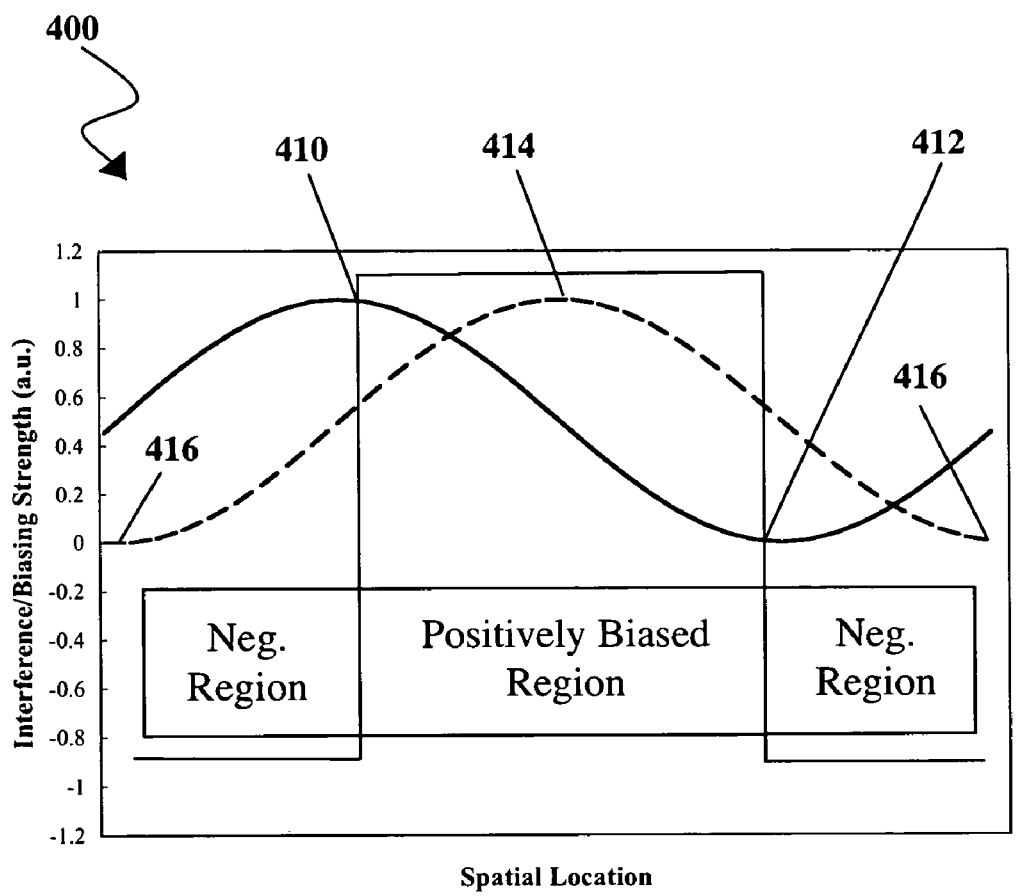
FIG. 9 is a diagram illustrating a biasing configuration relative to the fringes of two interference patterns for an apparatus according to the invention.

Suppose we want the electronically tuned, wavelength-dependent optical detector in this invention to distinguish between two different wavelengths. As described above, the apparatus 100 with the comb-like metal electrode 114 and the four metal electrodes 118, 120, 122 and 124 is required. This is the minimum modified MSM device section size. Take the wavelength in the spatially varying light intensity aligned with the metal electrodes 118, 120, 122 and 124, such as that corresponding to the dashed curve 414 in FIG. 9, to be 860 nm. This is the wavelength to be detected. Metal electrodes 120 and 122 at the positive portions of the cycle corresponding to this wavelength have positive control voltage. Metal electrodes 118 and 124 at the negative portions of the cycle corresponding to this wavelength have negative control voltage. The relative phase between spatially varying intensity pattern for this wavelength and spatially varying intensity pattern for the neighboring wavelength that is not to be detected, such as the solid curve in FIGS. 8 and 9, is taken to be $\pi/2$. Furthermore, the neighboring wavelength that is not to be detected is taken to be 860.24 nm. For an arbitrary wavelength $\lambda$, constructive superposition at each metal electrode 118, 120, 122 and 124 requires $$m\lambda = (m+\phi/2\pi)860.$$

Taking m=896 as an illustrative example and rearranging we have $$\phi = 2\pi[896(\lambda-860)/860].$$

The integrated intensity I over one period (0 to $2\pi$) is $I = I_1 - I_2$, where $I_1 \propto \int (1+\sin(\theta-\phi))\, d\theta$ evaluated between 0 and $\pi$ and $I_2 \propto \int (1+\sin(\theta-\phi))\, d\theta$ evaluated between $\pi$ and $2\pi$. After some math, we find that $$I \propto 4 \cos(\phi) = 4 \cos(2\pi[896(\lambda-860)/860]).$$

For $\lambda=860$ nm, I=1. For $\lambda=860.24$ nm, I=0. This value of I corresponds to $\phi=\pi/2$, the phase shift between the two spatially varying light intensity patterns of the two wavelengths that we wished to discriminate between. Since the spatially varying light intensity pattern corresponding to the wavelength we wanted to detect (860 nm) is aligned with the metal electrodes 118, 120, 122 and 124, this result is tantamount to saying that the phase shift of the spatially varying light intensity pattern that we do not want to detect, i.e., the one corresponding to a wavelength of 860.24 nm, relative to the metal electrodes 118, 120, 122 and 124 is $\pi/2$. This, in turn, indicates the relative placement and biasing of the metal electrodes 118, 120, 122 and 124 in the apparatus 100 relative to the spatially varying light intensity corresponding to this wavelength. If we now wish to use the same detector to detect light of wavelength 860.24 nm and not detect light of wavelength 860 nm, we merely need to change the biasing of the fingers. Biasing metal electrodes 118 and 120 positively and metal electrodes 122 and 124 negatively will cause wavelength 860.24 nm to be detected and wavelength 860 nm not to be detected. This change in biasing corresponds to shifting the biasing pattern by a phase of $\pi/2$. Hence merely changing the biasing of the electrodes in the detector changes the wavelengths that it will detect and those that it will not detect.

To discriminate between 4 wavelengths (for example, 860 nm, 860.24 nm, 860.48 nm and 860.72 nm), a second minimum modified MSM device section is required. Thus, there are now 8 metal electrodes, where each of the MSM device sections has electrodes such as 118, 120, 122 and 124. One of the minimum modified MSM device sections is placed in the interference pattern between the beams such that the relative phase between the spatially varying intensity patterns of two adjacent wavelengths is $\pi/4$. The second minimum modified MSM device section is placed in the interference pattern between the beams such that the relative phase between the spatially varying intensity patterns of two adjacent wavelengths is $3\pi/4$. Repeating the previous calculation with m=448 we find that $$I \propto \cos(2\pi[448(\lambda-860)/860]) + \cos(2\pi[1344(\lambda-860)/860]).$$

For $\lambda$=860 nm, I=2. For $\lambda$=860.24 nm, I=0. For $\lambda$=860.48 nm, I=0. For $\lambda$=860.72 nm, I=0. Once again, the arguments of the cosine functions at the wavelengths that are not to be detected correspond to the relative phases between the spatially varying light intensities (in this example, multiples of $\pi/4$ and $3\pi/4$). Once again, these phases indicate the relative placement and biasing of the metal electrodes, such as 118, 120, 122 and 124, in the apparatus 100 relative to the spatially varying light intensities corresponding to these wavelengths.

This invention can be generalized to discriminate between an arbitrarily large number of wavelengths. As such, this invention enables a wide tuning range. The results are summarized in Table I.

TABLE I

Generalized technique for electronically tuned, wavelength detection using modified MSM optical detectors.

| Number of Wavelengths to be Discriminated | Number of Minimum MSM device Sections | Relative Phase (Where to Place the MSM Device Sections) | Number of Metal Electrodes |
|---|---|---|---|
| 2 | 1 | $\pi/2$ | 4 |
| 4 | 2 | $\pi/4$, $3\pi/4$ | 8 |
| 8 | 4 | $\pi/8$, $3\pi/8$, $5\pi/8$, $7\pi/8$ | 16 |
| $2^N$ | $2^{N-1}$ | $\pi/2^N$, ..., $(2^N-1)\pi/2^N$ | $2^{N+1}$ |

Figure 5:
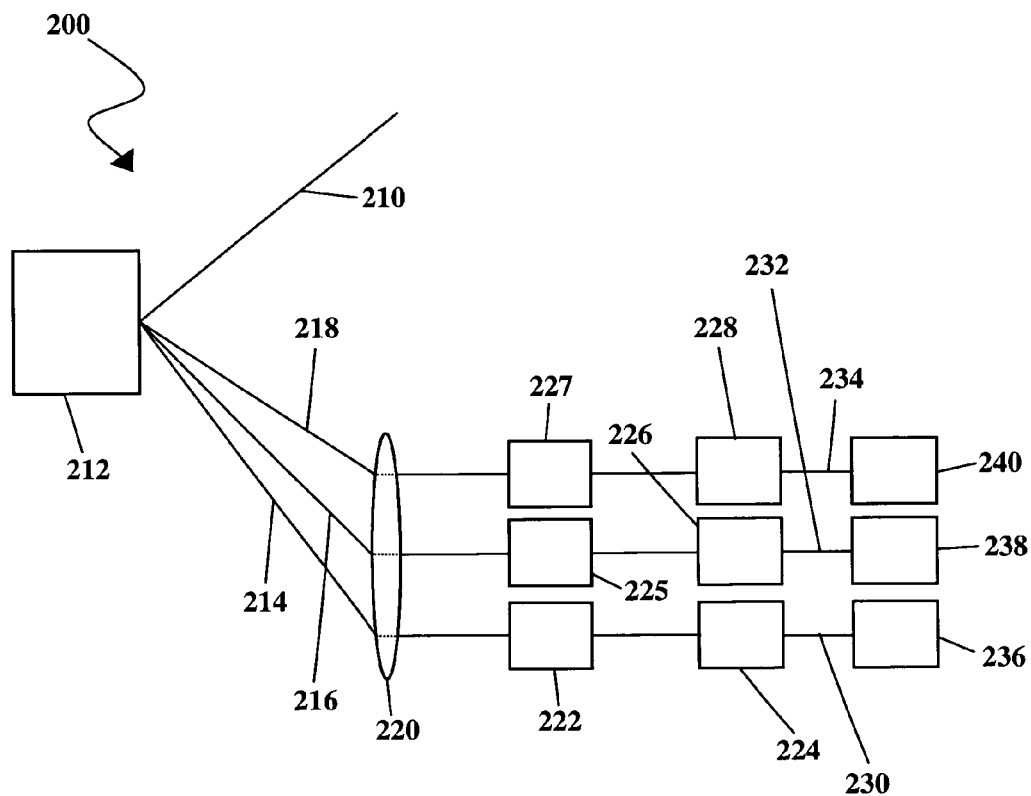
FIG. 5 is a diagram illustrating an optical system incorporating an apparatus according to the invention.

FIG. 5 shows an illustration of an embodiment of an optical system 200 that uses this invention. A stream of light 210 comprised of a plurality of wavelengths and containing information is at least partially spatially segregated by a dispersion device 212 into three optical beams 214, 216 and 218 each containing at least a wavelength and possibly a range of wavelengths. Suitable dispersion devices include, among others, a prism, a diffraction grating or an arrayed waveguide grating. The optical beams 214, 216 and 218 are collimated by a lens 220 and illuminated onto electronically tuned, wavelength-dependent optical detectors 224, 226 and 228, each of which is the same as the apparatus 160 as shown in FIG. 4. The optical detectors 224, 226, 228 are each connected 230, 232 and 234 to voltage means 236, 238 and 240. In an alternative embodiment, the voltage means 236, 238 and 240 are incorporated in the optical detectors 224, 226, 228. While this embodiment could use a standard photodetector that is neither wavelength-dependent nor dynamically tunable, such as those known in the prior art, the electronically tuned, wavelength-dependent optical detector of this invention still offers an advantage. In particular, the electronically tuned, wavelength-dependent optical detectors 224, 226 and 228 are able to detect the range of wavelengths in each beam 214, 216 and 218, thereby reducing the number of optical detectors 224, 226 and 228 in the optical system 200. In addition, in this example the dispersion device 212 provides coarse dispersion of the stream of light 210 and the optical detectors 224, 226 and 228 provide fine wavelength resolution. Standing wave generators 222, 225 and 227 are inserted between the lens 220 and optical detectors 224, 226 and 228 thereby producing a spatially varying light intensity on optical detectors 224, 226 and 228. Interferometer 500 is suitable for standing wave generators 222, 225 and 227. As described in the theory behind this invention described above, by appropriately positioning the spatially varying light intensity on optical detectors 224, 226 and 228 such that the metal electrodes 118, 120, 122 and 124 have the appropriate spatial phase relationship with the spatially varying light intensity and by applying the appropriate control voltage to each of the metal electrodes 118, 120, 122 and 124, particular wavelengths in the stream of light 210 can be selected for detection.

The interferometer 500 used as standing wave generators 222, 225 and 227 is also used to adjust the channel spacing. In an interferometer, a larger the optical path-length difference in the arms of the interferometer will result in a different phase for the fringes in the resultant interference pattern for a given wavelength since $\phi = 2\pi n \Delta d/\lambda$, where $\phi$ is the phase difference between the light in the arms of the interferometer that gives rise to the interference, n is the index of refraction, $\lambda$ is the wavelength and $\Delta d$ is the path-length difference. As described in the theory behind this invention described above, for discrimination between two wavelengths $\lambda_1$ and $\lambda_2$ a relative phase of $\pi/2$ is desired. In this case, the phase difference $\phi$ is $$\frac{2 \cdot \pi \cdot n \cdot \Delta d}{\lambda_1} - \frac{2 \cdot \pi \cdot n \cdot \Delta d}{\lambda_2} = \frac{\pi}{2}.$$

Dividing both sides of this equation by $2\pi$ yields $$n \cdot \Delta d \cdot \left(\frac{1}{\lambda_1} - \frac{1}{\lambda_2}\right) = n \cdot \Delta d \cdot \left(\frac{\lambda_2 - \lambda_1}{\lambda_1 \cdot \lambda_2}\right) = n \cdot \Delta d \cdot \left(\frac{\Delta \lambda}{\lambda_1 \cdot \lambda_2}\right) = \frac{1}{4}.$$

For telecommunication applications, wavelengths $\lambda_1$ and $\lambda_2$ are almost the same and can be taken to be approximately equal to wavelength $\lambda$, in this case the average of wavelengths $\lambda_1$ and $\lambda_2$. As a result, the required path length difference $\Delta d$ is inversely proportional to $1/\Delta\lambda$. Thus, increasing the optical-path length difference in the interferometer or the incident angle 516 of the beams of light 506 and 508 reduces the channel spacing. In addition, as mentioned previously in FIG. 10, the period of the fringes in the interference pattern is a function of the incident angle 516 given by $\lambda/(2 \sin(\Omega))$.

Figure 6:
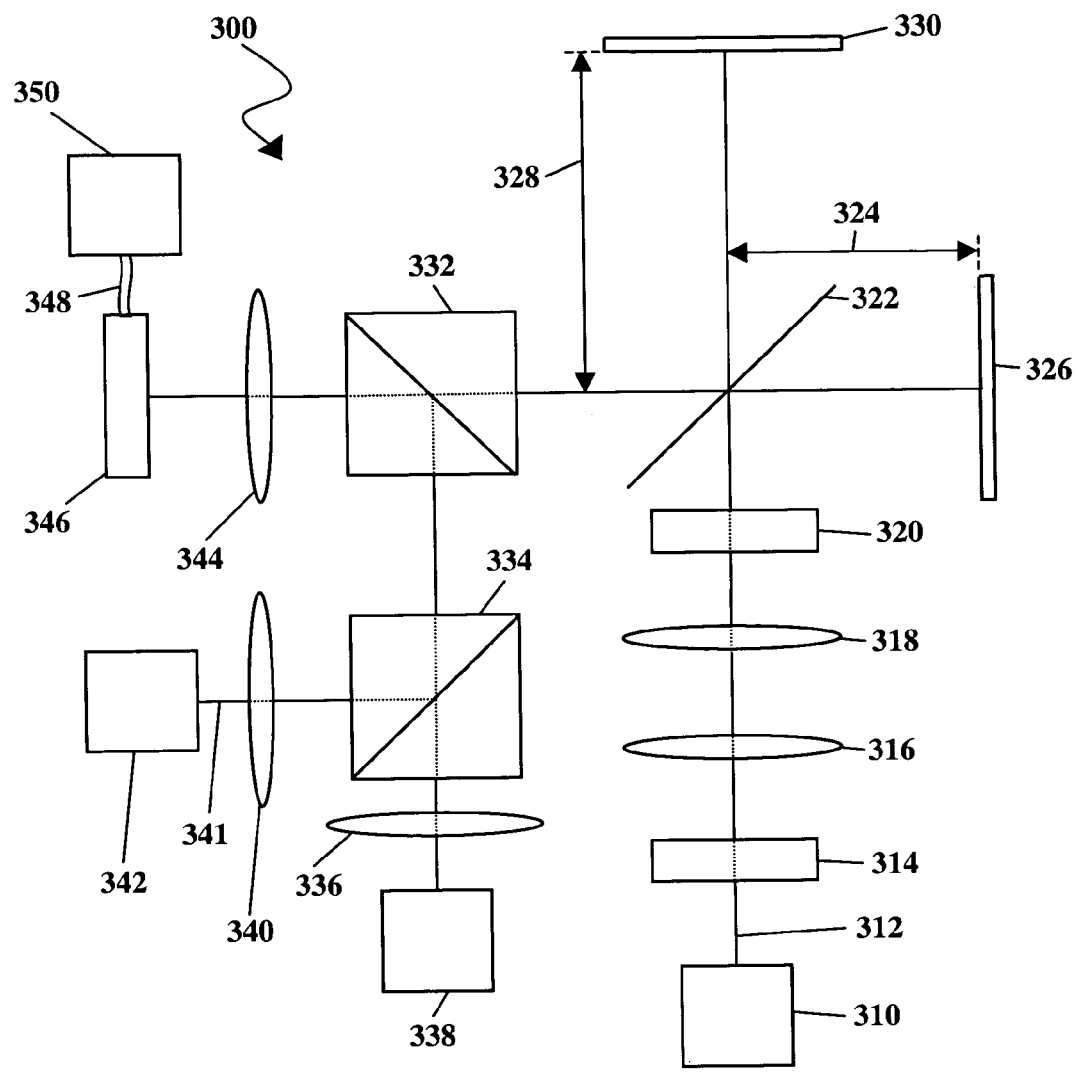
FIG. 6 is a diagram illustrating an experimental set-up.

This embodiment of this invention is further illustrated in FIG. 6, which shows a schematic of the experimental setup 300 used to perform measurements with an electronically tuned, wavelength-dependent optical detector 346 of this invention. A stream of light 312 is produced by a light source 310. A tunable Ti-Sapphire laser is suitable. The light 312 passes through a chopper 314, to enable sensitive lock-in detection, and lenses 316 and 318, which determine the size of the interference pattern on the optical detector 346. The light 312 passes through an attenuator 320 and is directed along two paths in the Michelson interferometer by a 50/50 beam splitter 322. The two paths have path lengths 324 and 328. As noted above, the path length difference $\Delta d$, which is twice the difference of path lengths 324 and 328, partially determines the phase difference $\phi$ and the channel spacing. After reflecting off of mirrors 326 and 330, the light passes through a beam splitter 332, a focal lens 344 and illuminates optical detector 346. While not shown in FIG. 6, two beams in the stream of light 312 illuminate the optical detector 346 at an angle, as shown in FIG. 10, producing an interference pattern (not shown) on the optical detector 346. Referring back to FIG. 6, the angle between the two beams is controlled by tilting mirrors 326 and 330. In practice, the tilt, the path length difference $\Delta d$ and wavelength $\lambda_1$ are fixed. As wavelength $\lambda_2$ varies, the relative phase is varied. The optical detector 346 is connected 348 to a voltage means 350. As disclosed in this invention, the position of the optical detector 346 relative to the fringes in the interference pattern is important. This is determined in this experimental setup 300 using an LED 342 to produce light 341 that is focused by a lens 340, passes through beam splitters 334 and 332, the focal lens 344 and illuminates the optical detector 346. The light reflected from the optical detector 346 passes through the focal lens 344, through the beam splitters 332 and 334, and is focused by a lens 336 onto a CCD camera 338.

Figure 7:
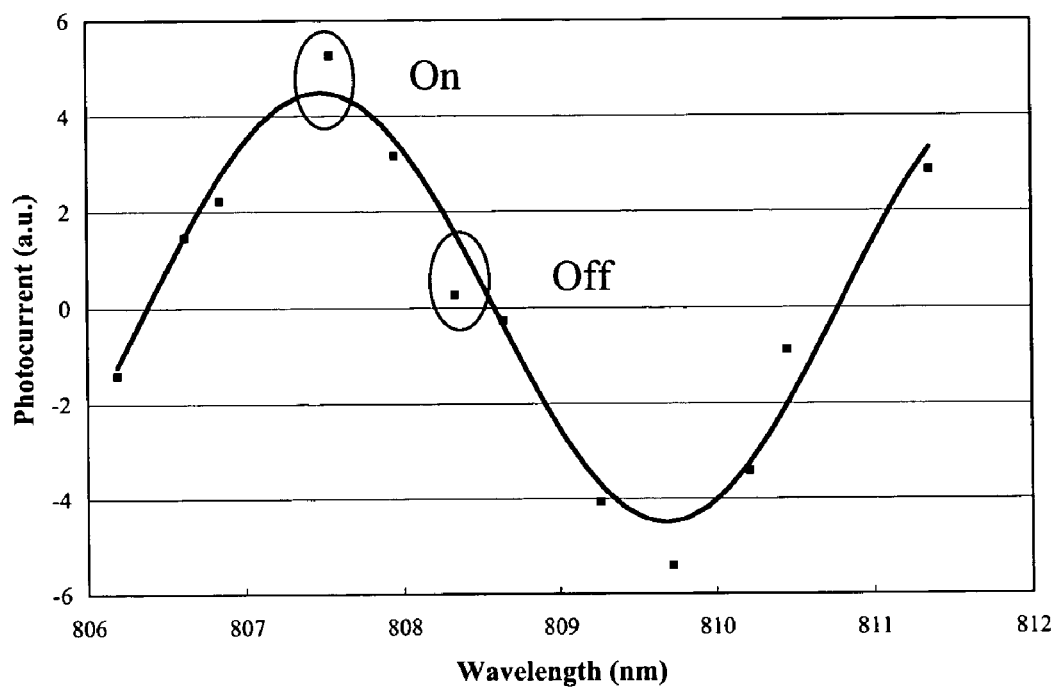
FIG. 7 is a diagram showing the measured photocurrent as a function of wavelength.

An electronically tuned, wavelength-dependent optical detector 346 of this invention has been fabricated where the spacing 115 and the width 117 of the comb-like metal electrode 114 and metal electrodes 118, 120, 122 and 124 are both 0.8 micron. The interdigitated pattern covers a 40 micron by 13.6 micron area. FIG. 7 shows the results of measurements performed using the optical detector 346 to distinguish two neighboring wavelengths. Positive control voltage of 2.1 V was applied to the metal electrodes 120 and 122 in the optical detector 346 by the voltage means 350 and negative control voltage of −1.25 V was applied to the metal electrodes 118 and 124 in the optical detector 346 by the voltage means 350 as illustrated schematically in FIGS. 8 and 9. The optical detector 346 is sensitive to the wavelength labeled "On" at 807.54 nm and is insensitive to the wavelength labeled "Off" at 808.33 nm. The theoretical sinusoidal response of the optical detector 346 is also shown. The demonstrated channel spacing of 0.76 nm is sufficient to enable a 365 GHz channel spacing in a WDM system. Additional experiments were able to resolve a channel spacing of 50 GHz. The channel spacing capability of the experimental setup 300 is limited by the line width and discontinuous tuning of the light source 310 not the capabilities of the optical detector 346.

Figure 11:
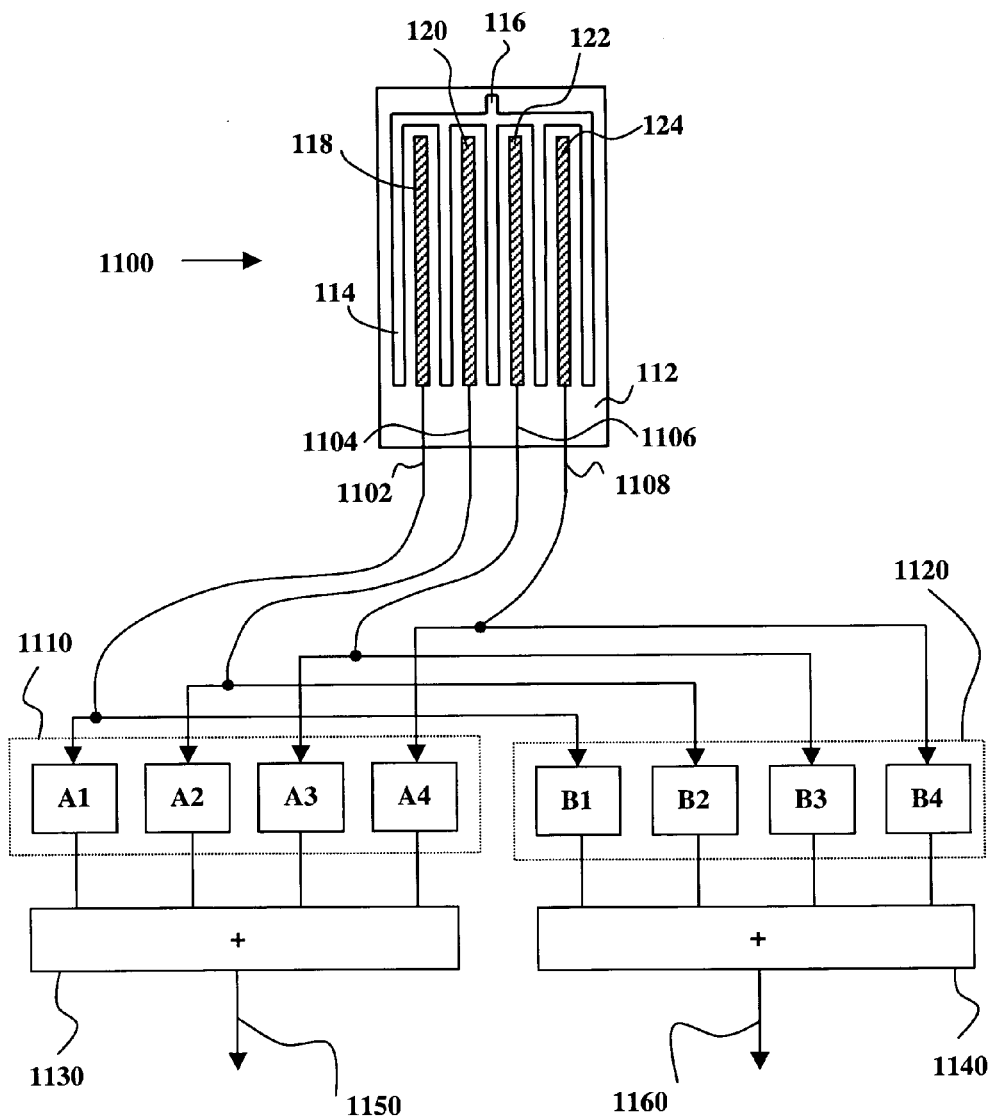
FIG. 11 shows an electronic wavelength demultiplexer according to an embodiment of the invention.

FIG. 11 shows an electronic wavelength division demultiplexer according to an embodiment of the invention, and is best appreciated by comparison to the embodiment of FIG. 2. On FIG. 2, voltage source 130 provides individual control voltages to electrodes 118, 120, 122, and 124 for setting the wavelength response of the detector output (i.e., the current from electrode 116). On FIG. 11, a modified wavelength dependent detector 1100 according to the invention is shown, which is similar to the detector of FIG. 2 except that the roles of input and output are reversed. More specifically, electrodes 118, 120, 122, and 124 provide corresponding individual outputs (e.g., currents) 1102, 1104, 1106, and 1108, while electrode 116 provides the bias voltage for detector 1100. Thus when detector 1100 is illuminated with optical radiation having a spatial pattern, outputs 1102–1108 effectively sample this pattern. If the spatial pattern is wavelength dependent, then so is the distribution among outputs 1102–1108. Equivalently, outputs 1102–1108 have different wavelength responses. Such wavelength dependence of multiple outputs can be exploited to create an electronic wavelength division demultiplexer, as shown on FIG. 11.

More specifically, outputs 1102–1108 are connected to a first amplifier array 1110 and also to a second amplifier array 1120. Note that intersecting lines without a filled circle on top of the intersection point are not electrically connected on FIG. 11. In amplifier array 1110, gains A1–A4 are applied to inputs 1102–1108 respectively. Similarly, in amplifier array 1120, gains B1–B4 are applied to inputs 1102–1108 respectively. The outputs from amplifier arrays 1110 and 1120 are received by summing junctions 1130 and 1140 to provide outputs 1150 and 1160 respectively. By setting gains A1–A4 appropriately, the wavelength dependence of output 1150 can be controlled. Similarly, setting the gains B1–B4 determines the wavelength dependence of output 1160. Thus outputs 1150 and 1160 are generally weighted sums of the inputs 1102–1108. For example, one approach for setting these gains is to use values limited to +1 and −1, and in this case, the gains to use can be determined by analogy to the examples of FIGS. 8 and 9, where regions of positive bias and negative bias are defined.

Suppose gains A1–A4 are set such that output 1150 has a maximum value at $\lambda_1$ and has a minimum value close to zero at $\lambda_2$, and gains B1–B4 are set such that output 1160 has its maximum and minimum values at $\lambda_2$ and $\lambda_1$ respectively. Then the embodiment of FIG. 11 acts as a wavelength division multiplexer, since "channel 1" at $\lambda_1$ appears only at output 1150, while "channel 2" at $\lambda_2$ appears only at output 1160. Note that this demultiplexing function is mainly performed electronically, since the only optical element before detector 1100 is an interferometer (not shown) for creating a wavelength-dependent spatial pattern on detector 1100. Such electronic wavelength demultiplexing advantageously provides a remarkable degree of flexibility. For example, the channels that outputs 1150 and 1160 are sensitive to can be altered by electronically setting the gains A1–A4 and B1–B4. These two outputs can be electronically tuned to widely separated wavelengths, or to nearby wavelengths, or even to the same wavelength (i.e., a non-blocking broadcast capability is inherent in this approach). Since tuning is performed entirely electronically, it can be performed much more rapidly than in wavelength demultiplexers that are tuned by altering an optical configuration. Although only four outputs and two output channels are shown on FIG. 11 for simplicity, the invention can be practiced with any number of outputs and output channels.

Figure 12:
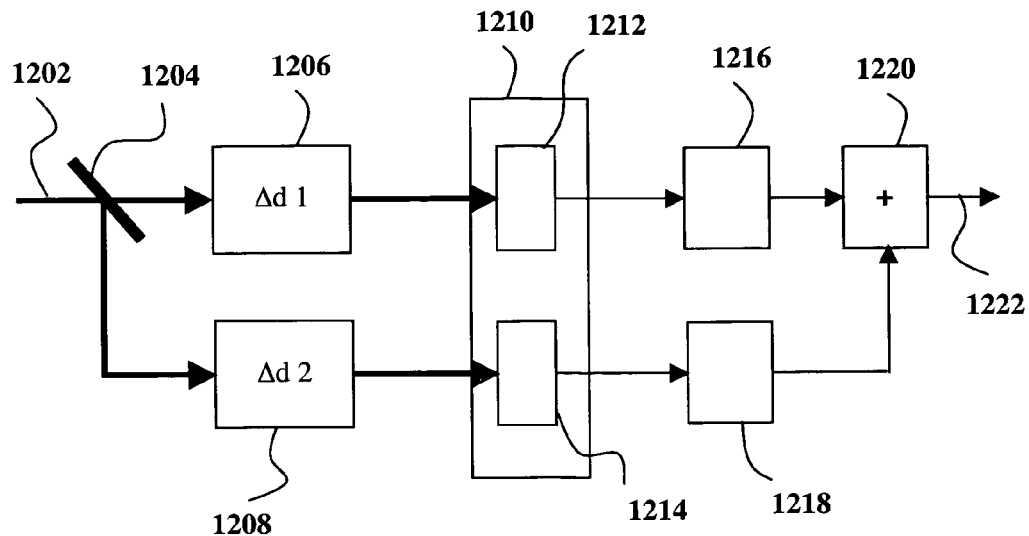
FIG. 12 shows an embodiment of the invention having two interference patterns at corresponding detector regions, where the contribution from each region is adjusted electrically.

FIG. 12 shows an embodiment of the invention where two different interference patterns are formed on a detector. More specifically, an optical input 1202 is provided to an interferometer 1206 and to an interferometer 1208 (e.g., by using a beam splitter 1204 as shown). Any other method of splitting optical input 1202 is also suitable for practicing the invention. Interferometers 1206 and 1208 have path length differences $\Delta d_1$ and $\Delta d_2$ respectively, which differ. A detector 1210 has separate photodetection regions 1212 and 1214. Preferably, detector 1210 is a monolithic semiconductor structure including integrated regions 1212 and 1214. An interference pattern formed by interferometer 1206 is incident on region 1212, and an interference pattern formed by interferometer 1208 is incident on region 1214. Photodetection regions 1212 and 1214 provide a response which depends on the spatial pattern of incident radiation. For example, photodetection regions 1212 and 1214 can be MSM detectors as in FIG. 2 or FIG. 11, or can be other kinds of pattern-dependent detectors (e.g., PIN detectors). For MSM detectors illuminated with an interference pattern having fringes as discussed above, the output $y(\lambda)$ for wavelengths $\lambda$ near a center wavelength $\lambda_0$ can be expressed as $$y(\lambda) = A\cos\left(\frac{2\pi n\Delta d(\lambda - \lambda_0)}{\lambda_0^2}\right),$$

where $\Delta d$ is the interferometer path length difference, n is the index of refraction and A is the amplitude. The outputs from regions 1212 and 1214 are scaled by amplifiers 1216 and 1218 respectively, and are then combined in a summing junction 1220 to provide a combined output $z(\lambda)$ at 1222. For detector outputs as given above, the combined output $z(\lambda)$ is given by $$z(\lambda) = A\left[C_1\cos\left(\frac{2\pi n\Delta d_1(\lambda - \lambda_0)}{\lambda_0^2}\right) + C_2\cos\left(\frac{2\pi n\Delta d_2(\lambda - \lambda_0)}{\lambda_0^2}\right)\right],$$

where $C_1$ and $C_2$ are the scaling coefficients provided by amplifiers 1216 and 1218 respectively.

The embodiment of FIG. 12 thus provides a detector having an output $z(\lambda)$ with a wavelength dependence that can be adjusted by altering the parameters $C_1$, $C_2$, $\Delta d_1$, and $\Delta d_2$. Such flexibility can be exploited by a designer to provide a detector having a response $z(\lambda)$ that approximates an arbitrary desired response $f(\lambda)$ over a certain wavelength range (e.g., $\lambda_a < \lambda < \lambda_b$). For example, $C_1$, $C_2$, $\Delta d_1$, and $\Delta d_2$ can be determined by numerically minimizing $$\int_{\lambda_a}^{\lambda_b} (f(\lambda) - z(\lambda))^2 \, d\lambda.$$

Algorithms for such determination are known in the art. An alternative approach for designing $z(\lambda)$ which provides additional insight is based on the similarity of the expression for $z(\lambda)$ to a finite Fourier series. In particular, if $\Delta d_2$ is set to an integer multiple of $\Delta d_1$, then $z(\lambda)$ is a finite Fourier series (without a DC or wavelength independent term).

This Fourier series approach for designing detector response enables simple approximate design of desired detector spectral responses. For example, suppose a square-wave detector response is desired having a 50% duty cycle. Since the first four Fourier coefficients for such a square wave are $\{1/2, 2/\pi, 0, -2/3\pi\}$, the corresponding detector design has $\Delta d_2 = 3\Delta d_1$, and $C_2/C_1 = -\frac{1}{3}$, where the DC term (i.e., the wavelength independent term) is neglected for now. Since this desired square wave has no second harmonic component, the two terms included in the approximation $z(\lambda)$ are the fundamental term and the third harmonic term.

Although FIG. 12 shows two interferometers 1206 and 1208 providing interference patterns to regions 1212 and 1214, interferometers 1206 and 1208 can be replaced by a single device or assembly (e.g., a MEMS device or assembly) that performs the same function (i.e., providing interference patterns at regions 1212 and 1214 having different wavelength dependences). The invention can also be practiced with more than 2 separate photodetection regions, each illuminated with a pattern having a different wavelength dependence. In this manner, the number of terms in the response $z(\lambda)$ can be increased, making it possible for $z(\lambda)$ to more closely approximate a desired wavelength response $f(\lambda)$. For example, adding a DC term (or a fifth harmonic term) to the above square wave Fourier series example will increase the accuracy of the approximation.

Figure 13:
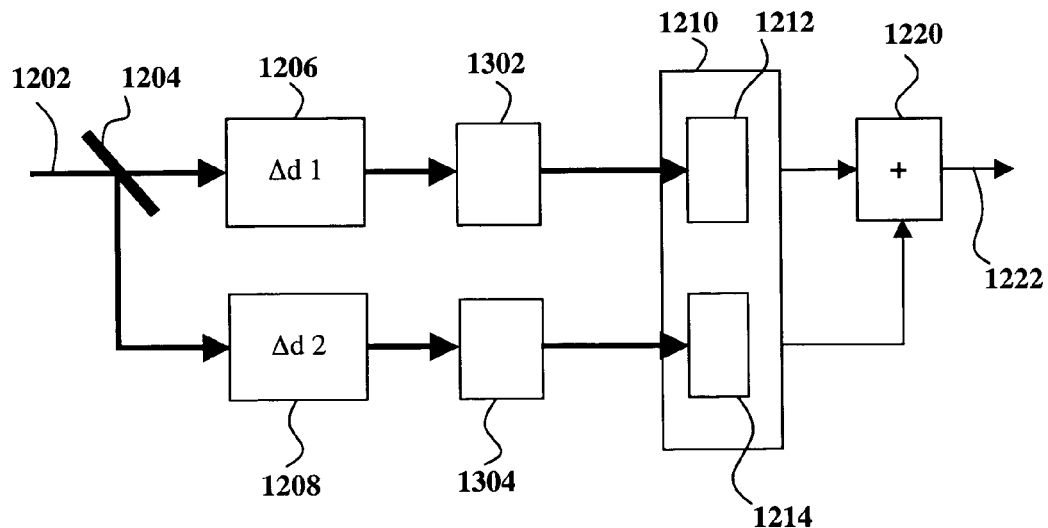
FIG. 13 shows an embodiment of the invention having two interference patterns at corresponding detector regions, where the contribution from each region is adjusted optically.

FIG. 13 shown an embodiment of the invention similar to the embodiment of FIG. 12, except that amplifiers 1216 and 1218 on FIG. 12 are not present and optical attenuators (or amplifiers) 1302 and 1304 are added. The function of attenuators 1302 and 1304 on FIG. 13 is to set the magnitudes of coefficients $C_1$ and $C_2$ in $z(\lambda)$. Since optical attenuation cannot provide the signs of $C_1$ and $C_2$, these signs are preferably set by appropriately biasing regions 1212 and 1214. For example, if regions 1212 and 1214 are MSM detectors as discussed above, then the signs of the outputs can be changed by biasing (e.g., by positively biasing the negative part of the interference pattern, and negatively biasing the positive part of the interference pattern, or vice versa). Alternatively, controllable inverters (not shown) can be placed between region 1212 and summing junction 1220 and between region 1214 and summing junction 1220 in order to set the signs of $C_1$ and $C_2$. Thus the relative values of $C_1$ and $C_2$ in $z(\lambda)$ can be set electronically (as in FIG. 12) and/or optically (as in FIG. 13). Although FIG. 13 shows attenuators 1302 and 1304 disposed after the corresponding interferometers, the invention can also be practiced with attenuators 1302 and 1304 disposed before the corresponding interferometers. As in the embodiment of FIG. 12, one or more interferometers can be used to provide two or more interference patterns having different wavelength dependences.

Figure 14:
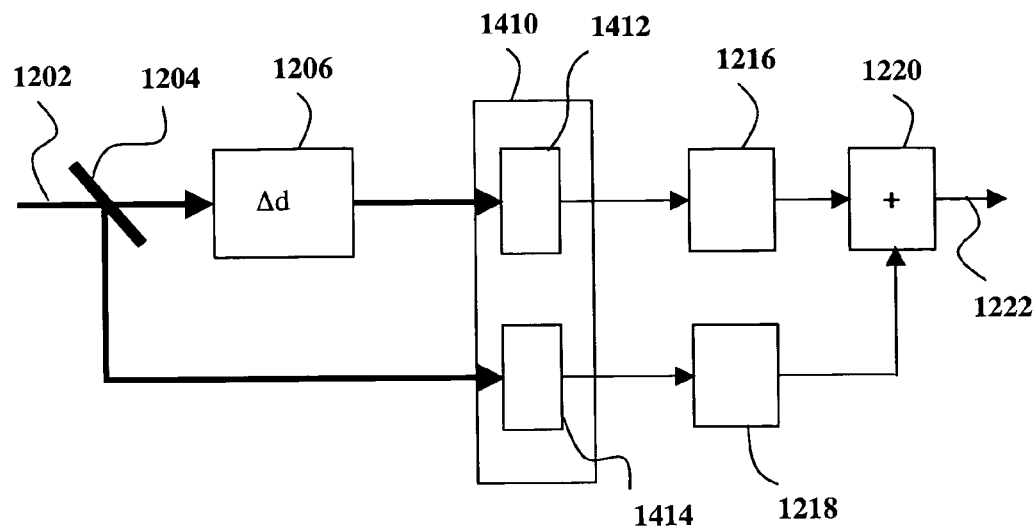
FIG. 14 shows an embodiment of the invention having an interference pattern and a wavelength-independent spot at corresponding detector regions, where the contribution from each region is adjusted electrically.

FIG. 14 shows an embodiment of the invention similar to the embodiment of FIG. 12, except that interferometer 1208 on FIG. 12 is removed. A detector 1410 includes photodetection regions 1412 and 1414. Photodetection region 1412 has a response that depends on the spatial pattern of incident radiation. Photodetection region 1414 need not provide a pattern-dependent response, and can therefore be any conventional detector region. In this embodiment, assuming region 1412 is an MSM detector as discussed above, the detector output $z_0(\lambda)$ at 1222 is given by $$z_0(\lambda) = A\left[C_0 + C_1\cos\left(\frac{2\pi n\Delta d_1(\lambda - \lambda_0)}{\lambda_0^2}\right)\right],$$

where $C_0$ is determined by amplifier 1218. This response can be regarded as a two-term Fourier series including the DC and fundamental terms. The invention can also be practiced with more than two terms in $z_0(\lambda)$, as indicated above in connection with FIG. 12.

Figure 15:
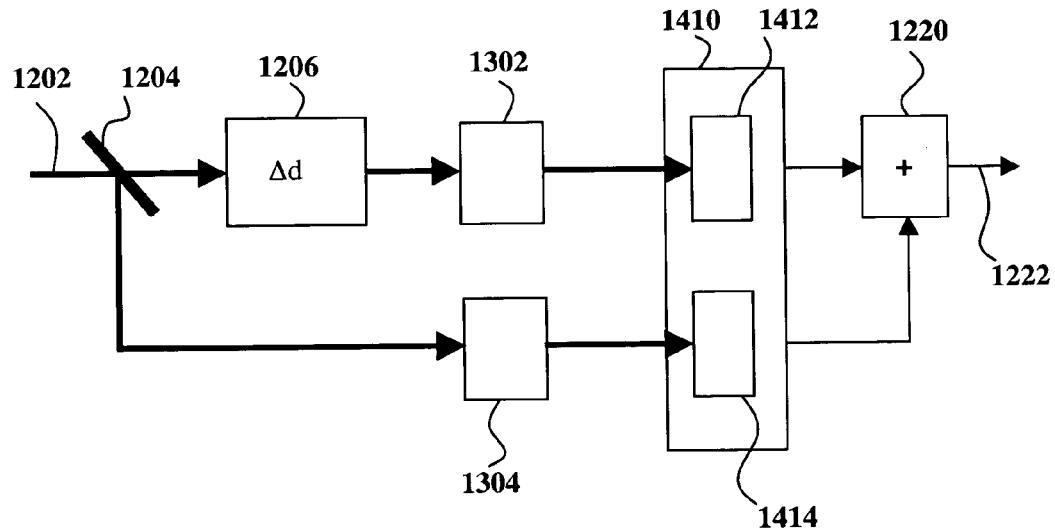
FIG. 15 shows an embodiment of the invention having an interference pattern and a wavelength-independent spot at corresponding detector regions, where the contribution from each region is adjusted optically.

FIG. 15 shows an embodiment of the invention similar to the embodiment of FIG. 13, except that interferometer 1208 on FIG. 13 is removed. Here the magnitude of $C_0$ is determined optically by attenuator 1304, and its sign is set as indicated in connection with FIG. 13. Here also, the number of terms in $z_0(\lambda)$ can also be greater than two.

The embodiments of FIGS. 12–15 can all be regarded as examples of a wavelength dependent detector having an optical subassembly including one or more interferometers. The optical subassembly provides two or more patterns to corresponding detector regions, where each pattern has a different dependence on wavelength. For example, on FIGS. 12 and 13, the two patterns are interference fringe patterns having different wavelength periods. On FIGS. 14 and 15, one pattern is an interference pattern having a periodic wavelength dependence, and the other pattern is a simple beam spot pattern having substantially no dependence on wavelength. One or more of the detector regions has a pattern-dependent response. Outputs from each detector region are combined according to weights to form a combined detector output. The weights can be set optically and/or electronically. For example, a weight such as $C_1$ can be determined by any combination of the split ratio of beam splitter 1204, loss in interferometer 1206, optical loss (or gain) in optical attenuator (or optical amplifier) 1302, and electronic gain (or loss) in electronic amplifier 1216. Electronic demultiplexing as shown in FIG. 11 is also applicable to the embodiments of FIGS. 12–15. For example, each photodetection region (such as 1212, 1214, 1412, and 1414) can provide two or more region suboutputs having different wavelength responses. One or more summing junctions (analogous to 1130 and 1140 on FIG. 11) can receive the weighted region suboutputs and provide corresponding junction outputs each having a wavelength response that is individually adjustable by changing the weights.

The electronically tuned, wavelength-dependent optical detector in this invention has numerous advantages with respect to wavelength-dependent optical detectors in the prior art. It is capable of rapid tuning for multiple wavelengths with sub-nanosecond switching time. Electronic tuning is at low voltages (unlike devices with an external micro-machined optical filter) allowing easy integration with CMOS electronics. The wavelength-dependence is substantially insensitive to temperature variations (unlike devices with an external cavity-based optical filters). The channel spacing can be adjusted dynamically. The wavelength-dependence of the apparatus 100 is integrated into the apparatus 100, obviating the need for an external optical filter. And, finally, by adding additional metal electrodes 118, 120, 122 and 124 and arms to the comb-like metal electrode 114 the electronically tuned, wavelength-dependent optical detector is capable of a wide tuning range limited only by the absorption characteristics of the semiconductor in the active layer of the apparatus 100.

In view of the above, it will be clear to one skilled in the art that the above embodiments may be altered in many ways without departing from the scope of the invention. Accordingly, the scope of the invention should be determined by the following claims and their legal equivalents.

What is claimed is:

1. An optical detector having an adjustable wavelength response to incident radiation, the detector comprising:
    a) a semiconductor substrate having a surface and including two or more laterally separated photodetection regions, each region having a corresponding region output, wherein at least one of said region outputs depends on an optical intensity distribution incident on said corresponding region, wherein a contribution of each of said region outputs to a combined output is adjustable; and
    b) an optical subassembly including one or more interferometers, said subassembly receiving said incident radiation and providing optical spatial patterns at said surface corresponding to each of said photodetection regions, wherein at least one of said patterns is an interference pattern having fringes, and wherein each of said patterns has a different dependence on wavelength;
    whereby said combined output has an adjustable wavelength response.

2. The detector of claim 1, further comprising one or more optical attenuators or amplifiers, each corresponding to one of said regions, and each disposed to alter an optical power incident on said corresponding region.

3. The detector of claim 1, further comprising one or more electrical amplifiers, each corresponding to one of said regions, and each disposed to alter said contribution of said corresponding region to said combined output.

4. The detector of claim 1, wherein one of said patterns has substantially no dependence on wavelength.

5. The detector of claim 1, wherein at least two of said patterns are interference fringe patterns having corresponding wavelength periods.

6. The detector of claim 5, wherein said wavelength periods are substantially integer multiples of a fundamental wavelength period.

7. The detector of claim 1, wherein each of said region outputs comprises a plurality of region suboutputs having different wavelength responses.

8. The detector of claim 7, further comprising one or more summing junctions, each summing junction having a junction output which is a weighted sum of said region suboutputs from each of said regions, whereby each of said junction outputs has an individually adjustable wavelength dependence for wavelength demultiplexing.

9. A method of optical detection having an adjustable wavelength response to incident radiation, the method comprising:
    a) providing a semiconductor substrate having a surface and including two or more laterally separated photodetection regions, each region having a corresponding region output, wherein at least one of said region outputs depends on an optical intensity distribution incident on said corresponding region;
    b) providing two or more optical spatial patterns at said surface corresponding to each of said photodetection regions, wherein at least one of said patterns is an interference pattern having fringes, and wherein each of said patterns has a different dependence on wavelength; and
    c) combining said region outputs to provide a combined output, wherein a contribution of each of said region outputs to said combined output is adjustable;
    whereby said combined output has an adjustable wavelength response.

10. The method of claim 9, further comprising altering an optical power incident on one or more of said regions with one or more corresponding optical attenuators or amplifiers.

11. The method of claim 9, further comprising altering said contribution of one or more of said regions to said combined output with one or more corresponding electrical amplifiers.

12. The method of claim 9, wherein one of said patterns has substantially no dependence on wavelength.

13. The method of claim 9, wherein at least two of said patterns are interference fringe patterns having corresponding wavelength periods.

14. The method of claim 13, wherein said wavelength periods are substantially integer multiples of a fundamental wavelength period.

15. The method of claim 9, wherein each of said region outputs comprises a plurality of region suboutputs having different wavelength responses.

16. The method of claim 15, further comprising providing one or more summing junctions, each summing junction having a junction output which is a weighted sum of said region suboutputs from each of said regions, whereby each of said junction outputs has an individually adjustable wavelength dependence for wavelength demultiplexing.

* * * * *